(12) United States Patent
Liu et al.

(10) Patent No.: US 10,870,799 B2
(45) Date of Patent: Dec. 22, 2020

(54) ETCHING SOLUTION FOR SELECTIVELY REMOVING TANTALUM NITRIDE OVER TITANIUM NITRIDE DURING MANUFACTURE OF A SEMICONDUCTOR DEVICE

(71) Applicant: Versum Materials US, LLC, Tempe, AZ (US)

(72) Inventors: Wen Dar Liu, Chupei (TW); Yi-Chia Lee, Chupei (TW)

(73) Assignee: VERSUM MATERIALS US, LLC, Tempe, AZ (US)

(*) Notice: Subject to any disclaimer, the term of this patent is extended or adjusted under 35 U.S.C. 154(b) by 0 days.

(21) Appl. No.: 16/108,529

(22) Filed: Aug. 22, 2018

(65) Prior Publication Data
US 2019/0085241 A1 Mar. 21, 2019

Related U.S. Application Data

(60) Provisional application No. 62/550,474, filed on Aug. 25, 2017.

(51) Int. Cl.
| | |
|---|---|
| *C09K 13/08* | (2006.01) |
| *H01L 21/3213* | (2006.01) |
| *C09K 13/06* | (2006.01) |
| *H01L 21/306* | (2006.01) |
| *H01L 21/8234* | (2006.01) |

(52) U.S. Cl.
CPC ............... *C09K 13/08* (2013.01); *C09K 13/06* (2013.01); *H01L 21/30604* (2013.01); *H01L 21/32134* (2013.01); *H01L 21/823412* (2013.01); *H01L 21/823431* (2013.01); *H01L 21/823437* (2013.01)

(58) Field of Classification Search
None
See application file for complete search history.

(56) References Cited

U.S. PATENT DOCUMENTS

| | | | |
|---|---|---|---|
| 8,389,418 B2 | 3/2013 | Epton | |
| 8,859,411 B2 | 10/2014 | Shimada et al. | |
| 2001/0051440 A1 | 12/2001 | Torek | |
| 2005/0014667 A1 | 1/2005 | Aoyama | |
| 2006/0131277 A1* | 6/2006 | Epton | ............... H01L 21/32134 216/102 |
| 2013/0015471 A1 | 1/2013 | Park | |
| 2015/0206963 A1 | 7/2015 | Ho | |
| 2016/0200975 A1* | 7/2016 | Cooper | .................. C09K 13/06 252/79.1 |

FOREIGN PATENT DOCUMENTS

| | | |
|---|---|---|
| CN | 103119693 A | 5/2013 |
| CN | 105297022 | 2/2016 |
| CN | 105304485 A | 2/2016 |
| EP | 2608249 A1 | 6/2013 |

(Continued)

*Primary Examiner* — Roberts P Culbert
(74) *Attorney, Agent, or Firm* — Anne B. Kiernan

(57) ABSTRACT

Described herein is an etching solution comprising water; phosphoric acid solution (aqueous); a fluoride ion source; and a water-miscible organic solvent. Such compositions are useful for the selective removal of tantalum nitride over titanium nitride from a microelectronic device having such material(s) thereon during its manufacture.

22 Claims, 1 Drawing Sheet

(56) References Cited

FOREIGN PATENT DOCUMENTS

| JP | 2004 190076 A | 7/2004 |
|---|---|---|
| KR | 1020110020474 A | 3/2011 |
| RU | 2396093 C1 | 8/2010 |
| WO | 2012048079 | 12/2012 |
| WO | 2017059051 A1 | 4/2017 |

* cited by examiner

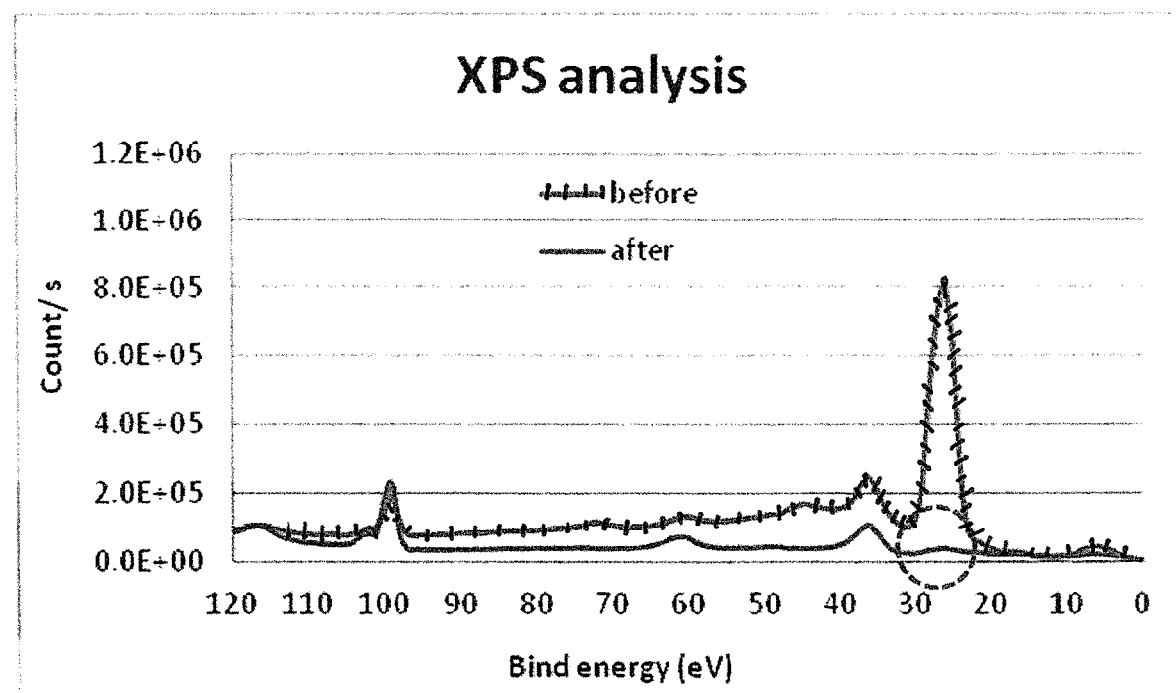

ETCHING SOLUTION FOR SELECTIVELY REMOVING TANTALUM NITRIDE OVER TITANIUM NITRIDE DURING MANUFACTURE OF A SEMICONDUCTOR DEVICE

CROSS REFERENCE TO RELATED APPLICATIONS

This application claims priority to U.S. provisional application 62/550,474 filed on Aug. 25, 2017, the entire contents of which is incorporated herein by reference thereto for all allowable purposes.

BACKGROUND OF THE INVENTION

The present invention relates to aqueous etching solutions used in the manufacture of semiconductor devices. More specifically, the invention provides an aqueous etching solution that exhibits increased etch selectivity of tantalum nitride films over titanium nitride films in composite semiconductor devices.

As the semiconductor industry has progressed into nanometer technology process nodes in pursuit of higher device density, higher performance, and lower costs, challenges from both fabrication and design issues have resulted in the development of three-dimensional designs, such as a Fin FET. Fin FET devices are a type of multi-gate structure that typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in the source/drain regions of the Fin FET device utilize, for example, phosphorous doped silicon-containing epitaxial layering.

A gate stack typically includes a first layer of amorphous silicon or polycrystalline silicon, commonly known as polysilicon, which is undoped, formed on a top surface of a gate dielectric layer, a second layer of polysilicon or amorphous silicon, which is n-type, formed on a top surface of the undoped polysilicon or amorphous silicon layer, to establish a desired work function in the gate, a layer of metal, which is under compressive stress, formed on a top surface of the second polysilicon or amorphous silicon layer, and a third layer of polysilicon or amorphous silicon formed on a top surface of the metal layer, to provide a silicon surface for subsequent formation of metal silicide. The compressively stressed metal may be titanium nitride (TiN), tantalum nitride (TaN), tungsten (W), molybdenum (Mo), or another metal that generates tensile stress in a channel region of the NMOS transistor, reduces diffusion of dopants between the lower layers polysilicon or amorphous silicon and the upper layer of polysilicon or amorphous silicon, and is compatible with anneal processes used in fabrication of the IC. In a complementary metal oxide semiconductor (CMOS) IC, which includes both NMOS and PMOS transistors, the n-type polysilicon layer and metal layer are patterned in NMOS transistor areas, while the first polysilicon or amorphous silicon layer and third polysilicon or amorphous silicon layer are patterned in both NMOS and PMOS transistor areas. An etching process is typically employed to reduce differences in height between gate stacks of the NMOS and PMOS transistors to facilitate gate pattern photolithographic processing.

When Finfet metal gate structures employ both TaN and TiN to achieve certain functionalities, it often is required to etch one material over the other. For example, during the manufacture of some NMOS devices it is necessary to etch TaN and stop at TiN but it is very difficult to stop on TiN using conventional wet etch compositions. Typically, increasing the composition of an oxidant, for example, increases the etch rate of the TaN but also increases the etch rate of the TiN and damage the layer. Accordingly, there is a need in the art for a wet etch chemistry that can selectively etch TaN over TiN.

BRIEF SUMMARY OF THE INVENTION

In one aspect, the present invention provides an etching solution suitable for the selective removal of TaN over TiN from a microelectronic device, which comprises: water; a phosphorous-containing inorganic acid or a salt thereof; a fluoride ion source; and a water-miscible organic solvent.

In another aspect, the present invention provides an etching solution suitable for the selective removal of TaN over TiN from a microelectronic device, which comprises: water; phosphoric acid or a salt thereof; a fluoride ion source; and a water-miscible organic solvent.

In another aspect an etching composition is provided comprising water, from about 0.5% to about 50% by weight of said phosphorous-containing inorganic acid (neat); from about 0.01% to about 20% by weight fluoride ion source (neat); and from about 1 to about 50% by weight water-miscible organic solvent.

In another aspect an etching composition is provided comprising water, from about 0.5% to about 35% or by weight or from about 1% to about 25% by weight of said phosphorous-containing inorganic acid (neat); from about 0.01% to about 10% by weight or from about 0.1% to about 10% by weight fluoride ion source (neat); and from about 1 to about 40% or from about 1 to about 30% by weight by weight water-miscible organic solvent. Alternatively, the compositions of this invention may comprise these and other components in any of the amounts described below in any combination of the amounts described below.

In another aspect, the present invention provides methods of selectively enhancing the etch rate of TaN relative to TiN on a microelectronic device comprising TaN and TiN, the method comprising the steps of: contacting the microelectronic device comprising TaN and TiN with an aqueous composition comprising water; phosphorous-containing inorganic acid or a salt thereof or phosphoric acid or a salt thereof; a fluoride ion source; and a water-miscible organic solvent; and rinsing the microelectronic device after the tantalum nitride is at least partially removed, wherein the selectivity of the etch for tantalum nitride over titanium nitride is greater than 3 or greater than 5 or greater than 8 or greater than 10 or greater than 15 or greater than 20 or greater than 25 or greater than 30. Any of the compositions of the invention may be used in the method of the invention. It may be desirable in some embodiments to provide a TiN etch rate of less than 1 Å/min, or less than than 0.8 Å/min, or less than 0.6 Å/min, or less than 0.4 Å/min, or less than 0.2 Å/min.

The embodiments of the invention can be used alone or in combinations with each other.

BRIEF DESCRIPTION OF THE DRAWINGS

FIG. 1 is a graph of an XPS analysis showing that a composition of the present invention removed most of a TaN layer after 3 minutes at 40° C.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the more narrow language of "consisting essentially of" and "consisting of".

Embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of TaN over TiN from a microelectronic device having such material(s) thereon during its manufacture.

It will be understood that the term "silicon" as deposited as a material on a microelectronic device will include polysilicon.

For ease of reference, "microelectronic device" or "semiconductor device" corresponds to semiconductor substrates (e.g. wafers), flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

A "composite semiconductor device" or "composite microelectronic device" means that the device has more than one materials and/or layers and/or portions of layers present on a non-conductive substrate. The materials may comprise high K dielectrics, and/or low K dielectrics and/or barrier materials and/or capping materials and/or metal layers and/or others known to persons of skill.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "high-K dielectric material" refers to a material with a high dielectric constant K (as compared to silicon dioxide). High-K dielectrics may be used to replace a silicon dioxide gate dielectric or another dielectric layer of a microelectronic device. The high-k material may be hafnium dioxide ($HfO_2$), hafnium oxynitride (HfON), zirconium dioxide ($ZrO_2$), zirconium oxynitride (ZrON), aluminum oxide ($Al_2O_3$), aluminum oxynitride (AlON), hafnium silicon oxide ($HfSiO_2$), hafnium aluminum oxide (HfAlO), zirconium silicon oxide ($ZrSiO_2$), tantalum dioxide ($Ta_2O_5$), aluminum oxide, $Y_2O_3$, $La_2O_3$, titanium oxide ($TiO_2$), aluminum doped hafnium dioxide, bismuth strontium titanium (BST), or platinum zirconium titanium (PZT).

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.001 wt. %. "Substantially free" also includes 0.000 wt. %. The term "free of" means 0.000 wt. %.

As used herein, "about" is intended to correspond to ±5% of the stated value. In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Note all percentages of the components are weight percentages and are based on the total weight of the composition, that is, 100%.

In the broad practice of this aspect, the etching solution of the present development comprises, consists essentially of, or consists of water; phosphoric acid solution (aqueous); a fluoride ion source; and a water-miscible organic solvent.

In some embodiments, the etching solution compositions disclosed herein are formulated to be substantially free of oxidizers such as, for example, peroxide compounds. Thus, in some embodiments, the etching solution compositions are free of hydrogen peroxide.

The headings employed herein are not intended to be limiting; rather, they are included for organizational purposes only.

Water

The etching compositions of the present development are aqueous-based and, thus, comprise water. In the present invention, water functions in various ways such as, for example, to dissolve one or more components of the composition, as a carrier of the components, as an aid in the removal of residue, as a viscosity modifier of the composition, and as a diluent. Preferably, the water employed in the cleaning composition is de-ionized (DI) water. Water may be added to the composition alone or as part of an aqueous solution of other components added to the composition, such as, an aqueous phosphoric acid and/or an aqueous fluoride ion source added to the composition. The ranges of water described in the next paragraph include all of the water in the composition from any source.

It is believed that, for most applications, the weight percent of water in the composition will be present in a range with start and end points selected from the following group of numbers: 0.5, 1, 5, 10, 15, 20, 25, 30, 40, 45, 48, 50, 55, 58, 60, 62, 65, 68, 70, 75, 80, 85, 90 and 95. Examples of the ranges of water that may be used in the composition include, for examples, from about 0.5% to about 60% by wt., or about 1% to about 60% by wt. of water; or from about 0.5% to about 40% by wt., or from about 1% to about 25% by wt., or from about 1% to about 20% by wt., or from about 1% to about 15% by wt.; or from about 5% to about 20% by wt.; or from about 5 to about 15% by wt. of water; or from about 40 to about 70% by wt. or from about 45% to about 75% by wt. of water; or from about 40% to about 60% by wt., or from about 45% to about 65% by wt., or from about 50% to about 70% by wt., or from about 50% to about 65% by wt.; or from about 40% to about 75% by wt.; or from about 30% by wt. to about 75% by wt. of water. Still other preferred embodiments of the present invention may include water in an amount to achieve the desired weight percent of the other ingredients.

Phosphorus-Containing Inorganic Acid

The etching compositions of the present invention comprise a phosphorus-containing inorganic acid or a salt thereof. The phosphorus-containing inorganic acid functions primarily to etch tantalum nitride (TaN). Examples of phosphorus-containing inorganic acids include, for example, phosphoric acid ($H_3PO_4$), hypophosphorus acid ($H_3PO_2$), phosphorus acid ($H_3PO_3$), hypophosphoric acid ($H_4P_2O_6$), metaphosphoric acid ($HPO_3$), peroxophosphoric acid ($H_3PO_5$), and salts thereof. Examples of salts include sodium salts of phosphoric acid, such as, $NaH_2PO_4$, $Na_2HPO_4$. Phosphorus-containing inorganic acids also include those where, for example, two or more orthophosphoric acid molecules are joined by condensation into larger molecules by elimination of water. Thus, a series of polyphosphoric acids can be obtained examples of which include pyrophosphoric acid ($H_4P_2O_7$), tripolyphosphoric acid ($H_5P_3O_{10}$), tetrapolyphosphoric acid ($H_6P_4O_{13}$), Trimetaphosphoric acid ($H_3P_3O_9$), and phosphoric anhydride ($P_4O_{10}$).

In some embodiments, phosphoric acid is employed. Commercial grade phosphoric acid can be used. Typically, the commercially available phosphoric acid is available as 80% to 85% aqueous solutions. In a preferred embodiment electronic grade phosphoric acid solutions are employed wherein such electronic grade solutions typically have a particle count below 100 particles/ml, and wherein the size of the particles is less than or equal to 0.5 microns and metallic ions are present in the acid in the low parts per million to parts per billion level per liter, for example 1 ppm or less. No other acids, such as nitric acid or sulfuric acid or mixtures thereof, are added to the composition of the present invention, with the exception of the possible addition of hydrofluoric acid. In some embodiments, HF may be added as a fluoride ion source.

Compositions of the present invention are substantially free or free of other oxidizing agents such as, for example, peroxide compounds. Thus, the compositions of the present invention are substantially free or free of peroxide compounds such as, for example, hydrogen peroxide, persulfates (e.g., monopersulfates and dipersulfates), percarbonates, and acids thereof, and salts thereof, and mixtures thereof.

Compositions of the present invention are also preferably substantially free or free of other oxidizing agents such as, for example, oxidized halides (e.g., iodates, periodates, and acids thereof, and mixtures thereof, and the like), perboric acid, perborates, percarbonates, peroxyacids (e.g., peracetic acid, perbenzoic acid, salts thereof, mixtures thereof, and the like), permanganates, cerium compounds, ferricyanides (e.g., potassium ferricyanide), mixtures thereof, and the like.

In some embodiments, the weight percent of phosphorus-containing inorganic acid or salts thereof (based on a neat composition) will be in a range with start and end points selected from the following group of numbers: 0.5, 1, 4, 5, 6, 8, 10, 15, 20, 25, 30, 35, 40, 45, 48, 50, 55, 58, 60, 62, 65, 68, 70, 75 and 80. Examples of the ranges of phosphorus-containing inorganic acid in the composition are from about 5% to about 80% by weight, or from about 10% to about 80% by weight, or from about 0.5% to about 35% by weight or from about 20% to about 70% by weight, or from about 30% to about 60% by weight, or from 35% to about 50% by weight, or from about 1 to about 40%, or from about 1 to about 25%, or from about 1 to about 20%, or from about 5 to about 20%, or from about 5 to about 15% by wt. In some embodiments, the amount of phosphorus-containing inorganic acid will comprise from about 10% to about 50% by weight of the composition.

Fluoride Ion Source

The etching compositions of the present disclosure also comprises one or more sources of fluoride ion. Fluoride ion functions principally to assist in removal of TaN. Typical compounds that provide a fluoride ion source according to the present invention are hydrofluoric acid, ammonium fluoride, quaternary ammonium fluorides such as, for example, fluoroborates, fluoroboric acid, tetrabutylammonium tetrafluoroborate, aluminum hexafluoride, and a fluoride salt of an aliphatic primary, secondary or tertiary amine having the formula:

$$R^1NR^2R^3R^4F,$$

wherein $R^1$, $R^2$, $R^3$ and $R^4$ individually represent H or a ($C_1$-$C_4$) alkyl group. Typically, the total number of carbon atoms in the $R^1$, $R^2$, $R^3$ and $R^4$ groups is 12 carbon atoms or less. Examples of fluoride salts of an aliphatic primary, secondary or tertiary amine such as, for example, tetramethylammonium fluoride, tetraethylammonium fluoride, methyltriethylammonium fluoride, and tetrabutylammonium fluoride.

In selecting the source of the fluoride ion, consideration should be given as to whether or not the source releases ions that would adversely affect the surface being cleaned. For example, in cleaning semiconductor elements, the presence of sodium or calcium ions in the cleaning composition can have an adverse effect on the surface of the element. In a preferred embodiment, the fluoride ion source is ammonium fluoride.

It is believed that the amount of the compound used as the source of the fluoride ion in the cleaning composition will, for most applications, comprise, about 0.01 to about 8% by weight or from about 0.01 to about 7% by weight of a solution 40% ammonium fluoride, or stoichiometric equivalent thereof. Preferably, the compound comprises from about 0.02 to about 8% by weight, more preferably from about 0.02 to about 6% by weight, still more preferably, about 1 to about 8% by weight, and most preferably, from about 0.025% to about 5% by weight of a solution of about 40% ammonium fluoride. In some embodiments, the composition will comprise about 0.01 to about 8% by weight or about 0.01 to about 7% by weight of a fluoride ion source, which may be provided by a 40% ammonium fluoride solution. Preferably, the compound comprises from about 0.02 to about 6% by weight of a fluoride ion source and, most preferably, from about 0.025% to about 5% or from about 0.04 to about 2.5% by weight of a fluoride ion source or from about 0.05 to about 15% by weight of a solution of 40% ammonium fluoride, most preferably, from about 0.0625% to about 12.5% or from about 0.1 to about 6.25% by weight of a solution of 40% ammonium fluoride. It should be understood that the amount of fluoride ion used will typically depend, however, on the particular substrate being cleaned. For example, in certain cleaning applications, the amount of the fluoride ion can be relatively high when cleaning substrates that comprise dielectric materials that have a high resistance to fluoride etching. Conversely, in other applications, the amount of fluoride ion should be relatively low, for example, when cleaning substrates that comprise dielectric materials that have a low resistance to fluoride etching.

For the purposes of clarity, the amount of the source of the fluoride ion in the cleaning composition, based on the addition of the fluoride ion source only (neat), may comprise, a weight percent in range having start and end points selected from the following list of weight percents: 0.001, 0.0016, 0.002, 0.0025, 0.004, 0.008, 0.01, 0.04, 0.05, 0.1, 0.4, 0.6, 1, 2, 2.4, 2.8, 3, 3.2, 5, 6, 10, 12, 15, and 20. For examples the amount of fluoride ion source (neat) in the composition may be from about 0.004 to about 3.2% by weight or from about 0.004 to about 2.8% by weight. The composition may comprises from about 0.008 to about 3.2% by weight, or from about 0.008 to about 2.4% by weight, or about 0.4 to about 3.2% by weight, or from about 0.01% to about 2% by weight, or 0.01% to about 10% by weight, or 0.01% to about 5% by weight of a fluoride ion source. In some embodiments, the composition will comprise about 0.004 to about 3.2% by weight of a fluoride ion source. The composition may comprise fluoride ion source or from about 0.001% to about 2% or from about 0.0016 to about 1% by weight of a fluoride ion source or from about 0.002 to about 6% by weight, or from about 0.0025% to about 5% or from about 0.04 to about 0.025% by weight. In yet other embodiments, the composition may comprise about 0.05 to about 20% by weight or about 0.1 to about 15%, or from about 0.1 to about 20, or from about 0.01 to about 20, or about 0.1 to about 10% or about 0.1 to about 5%, or from about 0.6 to about 12% or from about 1% to about 20% or from about 1 to about 15% or from about 1 to about 10% by weight % by weight of a fluoride ion source based on the addition of a neat fluoride ion source.

Water-Miscible Solvent

The etching compositions of the present invention comprise a water-miscible solvent. Examples of water-miscible organic solvents that can be employed are ethylene glycol, propylene glycol, butyl diglycol, 1,4-butanediol, tripropylene glycol methyl ether, propylene glycol propyl ether, diethylene gycol n-butyl ether (e.g., commercially available under the trade designation Dowanol DB), hexyloxypropylamine, poly(oxyethylene)diamine, dimethylsulfoxide, tetrahydrofurfuryl alcohol, glycerol, alcohols, sulfoxides, or mixtures thereof. Preferred solvents are alcohols, diols, or mixtures thereof. Most preferred solvents are diols such as, for example, propylene glycol.

In some embodiments of the present invention, the water-miscible organic solvent may comprise a glycol ether. Examples of glycol ethers include ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

It is believed that, for most applications, the amount of water-miscible organic solvent in the composition may be in a range having start and end points selected from the following list of weight percents: 0.5, 1, 5, 7, 12, 15, 20, 30, 35, 40, 50, 59.5, 65, 68, and 70. Examples of such ranges of solvent include from about 0.5% to about 59.5% by weight; or from about 1% to about 50% by weight; or from about 1% to about 40% by weight; or from about 0.5% to about 30% by weight; or from about 1% to about 30% by weight; or from about 5% to about 30% by weight; or from about 5% to about 15% by weight; or from about 7% to about 12% by weight of the composition.

Optional Ingredients

The etching composition of the present invention may also include one or more of the following additives: chelating agents, surfactants, chemical modifiers, dyes, biocides, and other additives. The additive(s) may be added to the extent that they do not adversely affect the performance of the composition.

Another optional ingredient that can be used in the etching composition is a metal chelating agent; it can function to increase the capacity of the composition to retain metals in solution and to enhance the dissolution of metallic residues. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N', N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine. Preferred chelating agents are aminocarboxylic acids such as EDTA, CyDTA and aminophosphonic acids such as EDTMP.

It is believed that the chelating agent, if present, will be in the composition in an amount of from about 0.1 wt. % to about 10 wt. %, preferably in an amount of from about 0.5 wt. % to about 5 wt. % of the composition.

In some embodiments the compositions of this invention will be free of or substantially free of any or all of the above-listed chelating agents added to the composition.

Other commonly known components such as dyes, surfactants, biocides etc. can be included in the cleaning composition in conventional amounts, for example, amounts up to a total of about 5 weight % of the composition.

In some embodiments the compositions of this invention will be free of or substantially free of any or all of dyes, surfactants, and/or biocides.

In some embodiments, the etching solution compositions disclosed herein are formulated to be substantially free or free of inorganic bases and/or quaternary ammonium hydroxides, for examples the composition may be substantially free or free of one or more of the following: tetramethylammonium hydroxide, tetraethylammonium hydroxide, methyltriethylammonium hydroxide, and/or tetrabutylammonium hydroxide. In some embodiments, the composition may be substantially free of or free of one or more of the following: hydroxides, metal hydroxides, such as KOH or LiOH or NaOH. In other embodiments, the composition may be substantially free of or free of a halide-containing compound other than one or more fluorine-containing compounds, for example it may be substantially free or free of one or more of the following: bromine-, chlorine- or iodine-containing compounds. In other embodiments, the composition may be substantially free or free of sulfonic acid and/or sulfuric acid and/or nitric acid and/or hydrochloric acid. In other embodiments, the composition may be substantially free or free of sulfates and/or nitrates and/or sulfites and/or nitrites. In other embodiments, the composition may be substantially free or free of: ammonium hydroxide and/or ethyl diamine. In other embodiments, the composition may be substantially free or free of: sodium-containing compounds and/or calcium-containing compounds and/or manganese-containing compounds or magnesium-containing compounds and/or chromium-containing compounds and/or sulfur-containing compounds and/or molybdenum-containing compounds. In other embodiments, the composition may be substantially free or free of: peroxy-compounds, i.e., compounds that comprise at least one peroxy group (—O—O—), such as peroxides and/or persulfates, and/or percarbonates, and/or acids thereof, and/or salts thereof, and/or mixtures thereof. In other embodiments, the composition may be free of or substantially free of one or more of the following (alone or in combination with any of the other components in this paragraph):iodates, periodates, perboric acid, perborates, peroxyacids (e.g., peracetic acid, perbenzoic acid, permanganates, cerium compounds, ferricyanides (e.g., potassium ferricyanide), or salts thereof, or mixtures thereof, and the like. The etching solution composition of the present invention is typically prepared by mixing the components together in a vessel at room temperature until all solids have dissolved in the aqueous-based medium.

Method

In another aspect there is provided a method for selectively enhancing the etch rate of the tantalum nitride relative to the titanium nitride in a composite semiconductor device comprising tantalum nitride and titanium nitride by etching the composite semiconductor device in a composition comprising, consisting essentially of, or consisting of phosphoric acid and a water miscible solvent. The method comprises the steps of contacting the composite microelectronic (semiconductor) device comprising tantalum nitride relative to the titanium nitride with the composition comprising, consisting essentially of, or consisting of phosphoric acid and a water miscible solvent; and rinsing the composite semiconductor device after the tantalum nitride is at least partially removed. An additional drying step may also be included in the method. "At least partially removed" means removal of at least 50% of the material, preferably at least 70% removal. Most preferably, at least 80% removal using the compositions of the present development.

The contacting step can be carried out by any suitable means such as, for example, immersion, spray, or via a single wafer process. The temperature of the composition during the contacting step is preferably from about 25 to about 150° C. or from about 25 to about 100° C. and more preferably from about 30 to about 60° C. The contacting step may be for 30 seconds to 60 minutes or 1 to 60 minutes or from 1 to 30 minutes. The process times may be adjusted depending upon the thickness of the one or more TaN layers to be etched and/or the one or more TiN layers present on the semiconductor device to be preserved.

In preferred embodiments, the etch selectivity of tantalum nitride over the titanium nitride observed with the composition of the present invention is at least about 2 or at least about 5. Preferably, the etch selectivity observed with the composition of the present invention is from about 5 to about 125 or more and, more preferably, from about 5 to about 80 or more, or at least about 9, or from about 9 to 125 or more, or from about 20 to 125 or more or from 30 to 125 or more.

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and an organic solvent such as, for example, isopropyl alcohol.

After the contacting step and the optional rinsing step is an optional drying step that is carried out by any suitable means, for example, isopropyl alcohol (IPA) vapor drying, heat, or by centripetal force.

The features and advantages are more fully shown by the illustrative examples discussed below.

EXAMPLES

General Procedure for Preparing the Cleaning Compositions

All compositions which are the subject of the present Examples were prepared by mixing the components in a 250 mL beaker with a 1" Teflon-coated stir bar. Typically, the first material added to the beaker was deionized (DI) water. Phosphoric acid is typically added next followed by the water-miscible solvent and the fluoride ion source.

Compositions of the Substrate

Test coupons were silicon wafers having 1000 Å TaN and silicon wafers having 1000 Å TiN.

Processing Conditions

Etching tests were run using 100 g of the etching compositions in a 250 ml beaker with ½" round Teflon stir bar set at 400 rpm. The etching compositions were heated to a temperature of about 40° C. on a hot plate. The test coupons were immersed in the compositions for about 20 minutes while stirring.

The etch rates were measured from 35° C. to 45° C. for 2 minutes for TaN wafer and 10 minutes for TiN wafer. The etch rates were calculated by the thickness difference before and after treatment divided by immersion time.

The segments were then rinsed for 3 minutes in a DI water bath or spray and subsequently dried using filtered nitrogen. The tantalum nitride and titanium nitride etch rates were estimated from changes in the thickness before and after etching and was measured by CDE 172 4 point resmap. Typical starting layer thickness was 1000 Å for tantalum nitride and 1000 Å for titanium nitride.

Comparative Example

The compositions in Tables 1 and 2 show that TaN could be etched by $H_2O_2$ in high alkali environment formulation. However, it is more aggressive on etching TiN film. The selectivity on TaN over TiN is less than one in $NH_4OH/H_2O_2$ solution. BOE ($HF/NH_4F$ mixture) was also tested but not as aggressive as $NH_4OH/H_2O_2$ platform.

TABLE 1

Etch Rate in $NH_4OH/H_2O_2$ Platform

|  | 248E | 248J |
|---|---|---|
| NH4OH(29%) | 10 | 0 |
| H2O2(30%) | 50 | 50 |
| DIW | 40 | 50 |
| TaN e/r @ 60 C. | 4.04 | 0.12 |
| TiN e/r @ 60 C. | 9.25 | 9.85 |
| TaN/TiN selectivity | 0.44 | 0.01 |

TABLE 2

Etch Rate in BOE ($HF/NH_4F$) Platform

|  | 248M | 248N |
|---|---|---|
| BOE | 100 | 50 |
| DIW |  | 50 |
| TaN e/r at 25 C. | 1.14 | 1.43 |
| TiN e/r at 25 C. | 1.9 | 1.93 |
| TaN/TiN selectivity | 0.60 | 0.74 |

Example 1

The compositions evaluated in Table 3 show that TaN can be selectively etched over TiN in the presence of ammonium fluoride.

TABLE 3

The Role of Ammonium Fluoride in Etching TaN

|  | 250E | 250G | 250I | 250J | 250K | 250L |
|---|---|---|---|---|---|---|
| DIW | 30 | 45 | 50 | 55 | 57.5 | 60 |
| NH4F(40%) | 30 | 15 | 10 | 5 | 2.5 | 0 |
| Glycerol | 30 | 30 | 30 | 30 | 30 | 30 |
| H3PO4 (85%) | 10 | 10 | 10 | 10 | 10 | 10 |
| TaN e/r at 40 C. | 4.88 | 5.52 | 4.97 | 4.92 | 1.38 | 0.14 |
| TiN e/r at 40 C. | 0.15 | 0.17 | 0.17 | 0.16 | 0.17 | 0.16 |
| TaN/TiN selectivity | 32.5 | 32.5 | 29.2 | 30.8 | 8.1 | 0.9 |

Example 2

The compositions evaluated in Table 4 show that $H_3PO_4$ is effective at etching TaN.

TABLE 4

The Role of Acid in Etching TaN

|  | 250O | 250S | 250T | 250U | 250V |
|---|---|---|---|---|---|
| DIW | 85 | 90 | 93 | 93 | 93 |
| NH4F(40%) | 5 | 5 | 5 | 5 | 5 |
| H3PO4 (85%) | 10 | 5 | 0 | 0 | 0 |
| Oxalic acid | 0 | 0 | 2 |  |  |
| Malonic acid |  |  |  | 2 |  |
| Citric acid |  |  |  |  | 2 |
| TaN e/r at 40 C. | 4.65 | 1.44 | 1.67 | 0.07 | 0.76 |
| TiN e/r at 40 C. | 0.17 | 0.16 | 0.18 | 0.17 | 0.17 |
| TaN/TiN selectivity | 27.4 | 9.0 | 9.3 | 0.4 | 4.5 |

Example 3

The compositions evaluated in Table 5 show that glycerol exhibited good potential for enhancing TaN etch selectivity over TiN.

TABLE 5

The Impact of Different Solvents on Etch Rates.

|  | 256I | 256M | 256N | 256O | 256P | 256Q |
|---|---|---|---|---|---|---|
| DIW | 30 | 30 | 30 | 30 | 30 | 30 |
| NH4F(40%) | 5 | 5 | 5 | 5 | 5 | 5 |
| H3PO4 (85%) | 15 | 15 | 15 | 15 | 15 | 15 |
| Glycerol | 50 |  |  |  |  |  |
| NMP |  | 50 |  |  |  |  |
| DPM |  |  | 50 |  |  |  |
| DMSO |  |  |  | 50 |  |  |
| DMAC |  |  |  |  | 50 |  |
| sulfolane |  |  |  |  |  | 50 |
| TaN e/r at 40 C. | 4.5 | 1.2 | 0.13 | 0.38 | 0.23 | 2.74 |

Example 4

Based on the studies above, an optimized formulation (257N) (Table 6) was applied on a TaN/TiN bilayer wafer. XPS was performed to check if top TaN is totally removed and TEM cross section was used to check if bottom TiN film is damaged or not.

TABLE 6

|  | 257N |
|---|---|
| DIW | 52.5 |
| NH4F(40%) | 7.5 |
| H3PO4 (85%) | 15 |
| PG | 25 |
| TaN e/r at 40 C. | 6.5 |

TABLE 6-continued

| | 257N |
|---|---|
| TiN e/r at 40 C. | 0.17 |
| TaN/TiN selectivity | 38.2 |

Referring to FIG. 1, the XPS signal indicated that most of the TaN layer was removed by formulation 257N at 40° C./3 mins.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching composition suitable for the selective removal of tantalum nitride over titanium nitride from a microelectronic device, which comprises:
   from about 40% to about 80% by weight water;
   from about 10% to about 50% by weight phosphorous-containing inorganic acid or salt thereof (neat);
   from about 0.1% to about 6% by weight fluoride ion source (neat); and
   from about 12% to about 35% by weight water-miscible organic solvent, wherein said etching solution is substantially free of oxidizing agents.

2. The etching composition of claim 1 wherein the water-miscible solvent is selected from the group consisting of ethylene glycol, propylene glycol, butyl diglycol, 1,4-butanediol, tripropylene glycol methyl ether, propylene glycol propyl ether, diethylene gycol n-butyl ether, hexyloxypropylamine, poly(oxyethylene)diamine, dimethylsulfoxide, tetrahydrofurfuryl alcohol, glycerol, alcohols, sulfoxides, or mixtures thereof.

3. The etching composition of claim 1 wherein the water-miscible solvent is selected from the group consisting of butyl diglycol, glycerol or propylene glycol or mixtures thereof.

4. The etching composition of claim 1 wherein the fluoride ion source is selected from the group consisting of hydrofluoric acid, ammonium fluoride, quaternary ammonium fluorides such as, for example, fluoroborates, fluoroboric acid, tetrabutylammonium tetrafluoroborate, aluminum hexafluoride, and a fluoride salt of an aliphatic primary, secondary or tertiary amine having the formula:

$R^1NR^2R^3R^4F$, wherein $R^1$, $R^2$, $R^3$ and $R^4$ individually represent H or a ($C_1$-$C_4$) alkyl group.

5. The etching composition of claim 4 wherein the fluoride ion source is selected from the group consisting of ammonium fluoride, ammonium bifluoride, tetramethylammonium fluoride, tetraethylammonium fluoride, methyltriethylammonium fluoride, and tetrabutylammonium fluoride and mixtures thereof.

6. The etching composition of claim 5 wherein said fluoride ion source comprises ammonium fluoride.

7. The etching composition of claim 1 wherein the phosphorous-containing inorganic acid is selected from the group consisting of phosphoric acid ($H_3PO_4$), hypophosphorus acid ($H_3PO_2$), phosphorus acid ($H_3PO_3$), hypophosphoric acid ($H_4P_2O_6$), metaphosphoric acid (HPO_3), peroxophosphoric acid ($H_3PO_5$), pyrophosphoric acid ($H_4P_2O_7$), tripolyphosphoric acid ($H_5P_3O_{10}$), tetrapolyphosphoric acid ($H_6P_4O_{13}$), trimetaphosphoric acid ($H_3P_3O_9$), and phosphoric anhydride ($P_4O_{10}$), and salts thereof and mixtures thereof.

8. The etching composition of claim 1 wherein the phosphorous-containing inorganic acid comprises phosphoric acid ($H_3PO_4$).

9. The etching composition of claim 1 wherein the composition comprises
   from about 50% to about 80% by weight water;
   from about 10% to about 30% by weight of said phosphorous-containing inorganic acid or salt thereof (neat); and
   from about 0.6% to about 5% by weight fluoride ion source (neat).

10. The etching composition of claim 1 wherein the composition comprises
    from about 50% to about 70% by weight water;
    from about 10% to about 25% by weight of said phosphorous-containing inorganic acid or salt thereof (neat);
    from about 1% to about 5% by weight fluoride ion source (neat); and
    from about 20% to about 30% by weight water-miscible organic solvent.

11. The etching composition of claim 1 wherein the composition comprises
    from about 55% to about 65% by weight water;
    from about 10% to about 20% by weight of said phosphorous-containing inorganic acid or salt thereof (neat);
    from about 1% to about 5% by weight fluoride ion source (neat); and
    from about 20% to about 30% by weight water-miscible organic solvent.

12. The etching composition of claim 1 wherein the composition provides a tantalum nitride over titanium nitride etch selectivity of at least 5.

13. A method of selectively enhancing the etch rate of tantalum nitride relative to titanium nitride on a microelectronic device comprising tantalum nitride and titanium nitride, the method comprising the steps of:
    contacting the microelectronic device comprising tantalum nitride and titanium nitride with an etching composition comprising from about 40% to about 80% by weight water; from about 10% to about 50% by weight phosphorous-containing inorganic acid or salt thereof (neat); from about 0.1% to about 6% by weight fluoride ion source (neat); and from about 12% to about 35% by weight water-miscible organic solvent; wherein said etching solution is substantially free of oxidizing agents; and
    rinsing the microelectronic device after the tantalum nitride is at least partially removed, wherein the selectivity of the etch for tantalum nitride over titanium nitride is greater than 3.

14. The method of claim 13 further comprising the step of drying the microelectronic device.

15. The method of claim 13 wherein the selectivity of the etch for tantalum nitride over titanium nitride is between about 9 and about 125.

16. The method of claim 13 wherein the contacting step is performed at a temperature of from about 25° C. to about 150° C.

17. The method of claim 13 wherein the water-miscible solvent is selected from the group consisting of ethylene glycol, propylene glycol, butyl diglycol, 1,4-butanediol, tripropylene glycol methyl ether, propylene glycol propyl ether, diethylene gycol n-butyl ether, hexyloxypropylamine, poly(oxyethylene)diamine, dimethylsulfoxide, tetrahydrofurfuryl alcohol, glycerol, alcohols, sulfoxides, or mixtures thereof.

18. The method of claim 13 wherein the fluoride ion source is selected from the group consisting of hydrofluoric acid, ammonium fluoride, quaternary ammonium fluorides such as, for example, fluoroborates, fluoroboric acid, tetrabutylammonium tetrafluoroborate, aluminum hexafluoride, and a fluoride salt of an aliphatic primary, secondary or tertiary amine having the formula:

$R^1NR^2R^3R^4F$, wherein $R^1$, $R^2$, $R^3$ and $R^4$ individually represent H or a $(C_1-C_4)$ alkyl group.

19. The method of claim 13 wherein the fluoride ion source is selected from the group consisting of ammonium fluoride, ammonium bifluoride, tetramethylammonium fluoride, tetraethylammonium fluoride, methyltriethylammonium fluoride, and tetrabutylammonium fluoride.

20. The method of claim 13 wherein the phosphorous-containing inorganic acid is selected from the group consisting of hypophosphorus acid ($H_3PO_2$), phosphorus acid ($H_3PO_3$), hypophosphoric acid ($H_4P_2O_6$), metaphosphoric acid ($HPO_3$), peroxophosphoric acid ($H_3PO_5$), pyrophosphoric acid ($H_4P_2O_7$), tripolyphosphoric acid ($H_5P_3O_{10}$), tetrapolyphosphoric acid ($H_6P_4O_{13}$), trimetaphosphoric acid ($H_3P_3O_9$), and phosphoric anhydride ($P_4O_{10}$), and salts thereof and mixtures thereof.

21. The etching composition of claim 1 wherein the composition is substantially free of hydrogen fluoride.

22. The etching composition of claim 3 wherein the phosphorous-containing inorganic acid comprises phosphoric acid ($H_3PO_4$) and wherein said fluoride ion source comprises ammonium fluoride.

* * * * *